(12) United States Patent
Dixon et al.

(10) Patent No.: US 6,552,629 B2
(45) Date of Patent: Apr. 22, 2003

(54) UNIVERSALLY STABLE OUTPUT FILTER

(75) Inventors: Jeffrey M. Dixon, Fremont, CA (US);
Charles Coles, San Jose, CA (US);
Andrew M. Cowell, San Jose, CA (US)

(73) Assignee: Micrel, Incorporated, San Jose, CA (US)

(*) Notice: Subject to any disclaimer, the term of this patent is extended or adjusted under 35 U.S.C. 154(b) by 36 days.

(21) Appl. No.: 09/735,694

(22) Filed: Dec. 12, 2000

(65) Prior Publication Data

US 2002/0070814 A1 Jun. 13, 2002

(51) Int. Cl.[7] .................................................. H03H 7/03
(52) U.S. Cl. ........................ 333/172; 333/175; 333/181
(58) Field of Search ................................. 333/167, 172, 333/175, 176, 181

(56) References Cited

U.S. PATENT DOCUMENTS

| | | | |
|---|---|---|---|
| 4,908,566 A | 3/1990 | Tesch | |
| 4,933,826 A | 6/1990 | Person | |
| 5,132,606 A | 7/1992 | Herbert | |
| 5,168,209 A | 12/1992 | Thiel | |
| 5,260,862 A | * 11/1993 | Marsh | ........................ 363/39 |
| 5,373,225 A | 12/1994 | Poletto et al. | |
| 5,506,496 A | 4/1996 | Wrathall et al. | |
| 5,559,424 A | 9/1996 | Wrathall et al. | |
| 5,596,265 A | 1/1997 | Wrathall et al. | |
| 5,648,718 A | 7/1997 | Edwards | |
| 5,889,393 A | 3/1999 | Wrathall | |
| 5,920,468 A | * 7/1999 | Brisson et al. | ................ 363/39 |
| 6,064,187 A | 5/2000 | Redl et al. | |
| 6,088,217 A | 7/2000 | Patel et al. | |

* cited by examiner

Primary Examiner—Seungsook Ham
(74) Attorney, Agent, or Firm—Dorsey & Whitney LLP (57) ABSTRACT

In accordance with the teachings of this invention a novel method and apparatus is taught which provides for the stabilizing of an output signal through an output circuit having a compensation circuit coupled with an output capacitor, such that the compensation circuit is configured to compensate for an equivalent series resistance of the output capacitor. The compensation circuit compensates for the equivalent series resistance by providing a shift in a phase of the output signal to stabilize the output signal. The shift in phase is accomplished through the addition of a second zero at a second zero frequency to stabilize the output signal. The second zero is added such that the second zero frequency is closer to a first pole frequency than a first zero frequency, where the first pole frequency is proportional to the equivalent series resistance and the first zero is proportional to the output capacitor. The compensation circuit includes at least a compensation inductor and a compensation resistor, and the output capacitor is a ceramic capacitor.

16 Claims, 8 Drawing Sheets

UNIVERSALLY STABLE OUTPUT FILTER

TECHNICAL FIELD

This invention pertains to a method and apparatus for providing a stable output signal, and more particularly to a method and apparatus for providing a stable output signal with significantly reduced noise and ripple without the use of Tantalum or other types of capacitors having relatively large equivalent series resistance.

BACKGROUND

Figure 1:
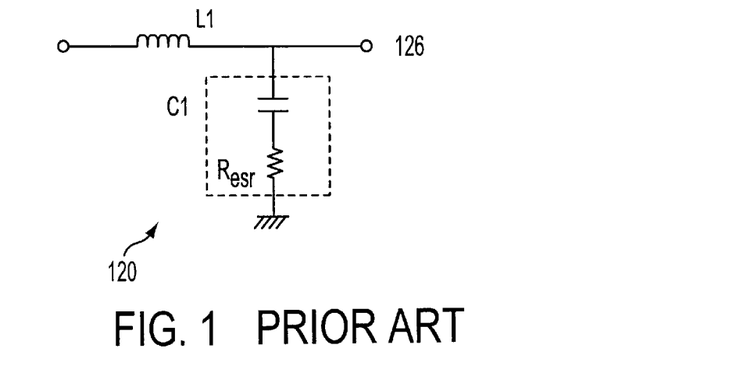
FIG. 1 depicts a prior art output stage of a voltage regulator comprising an inductor, and a capacitor having an equivalent series resistance.

Many electrical and electronic circuits, including voltage regulators such as switching regulators, implement an output stage to stabilize a generated output signal supplied to a load by reducing the amount of noise and ripple in the output signal. In an attempt to stabilize the output voltage across the load, the output stage of most switching regulators employ a network of inductive and capacitive energy storage elements which attempt to provide a continuous, stable and regulated output voltage. FIG. 1 depicts an output stage 120 of a voltage regulator comprising an inductor L1, and a capacitor C1 having an equivalent series resistance (ESR) $R_{esr}$.

Regulated power systems, such as switching regulators, employ negative feedback and various sampling techniques to maintain output voltage or current regulation. These feedback systems need to maintain a sufficient phase margin, for example 35°, to ensure stability. If a sufficient phase margin is not maintained the output regulation is negatively impacted with unacceptable oscillations.

The stability of the output signal 126 is significantly affected by the poles and zeros introduced by output stage 120. A first pole P1 results from the cooperation of the inductor L1 and capacitor C1 is introduced by output stage 120 at a first pole frequency $f_{P1}$, approximated by:

$$f_{p1}=1/(2\pi*sqrt(L1*C1)). \qquad \text{Eq. 1}$$

Output stage 120 also generates a zero Z1 at a zero frequency $f_{z1}$ which is approximated by:

$$f_{z1}=1/(2\pi*C1*R_{esr}) \qquad \text{Eq. 2}$$

As can be seen from equation 2, the ESR resistance of output capacitor C1 affects the resulting zero frequency $f_{z1}$. Because of this ESR effect on the zero frequency $f_{z1}$, capacitors having relatively high ESR resistance are utilized for output capacitor C1 to provide a zero Z1 at a zero frequency $f_{z1}$ which will maintain a phase margin at a sufficient level to achieve the desired stable output signal 126.

Pole frequency $f_{p1}$ defined by equation 1 is substantially equal for most capacitors utilized, whether a Tantalum, aluminum electrolytic, ceramic or other capacitor is used, assuming their capacitance is approximately equal. However, because the ESR is different for different types of capacitors, the zero frequency $f_{z1}$ for zero Z1 will not be equal for different types of capacitors. For example, because of the relatively large difference in ESR resistance between ceramic and Tantalum capacitors, there is a relatively large difference in the zero frequencies $f_{z1}$. Typically, the ESR resistance associated with a Tantalum capacitor is in the order of 10 to 40 times the ESR resistance of the ceramic capacitor for substantially equivalent capacitive values. This large difference in ESR resistance results in a relatively large difference in the zero frequency $f_{z1}$ as defined by equation 2.

Figure 2A:
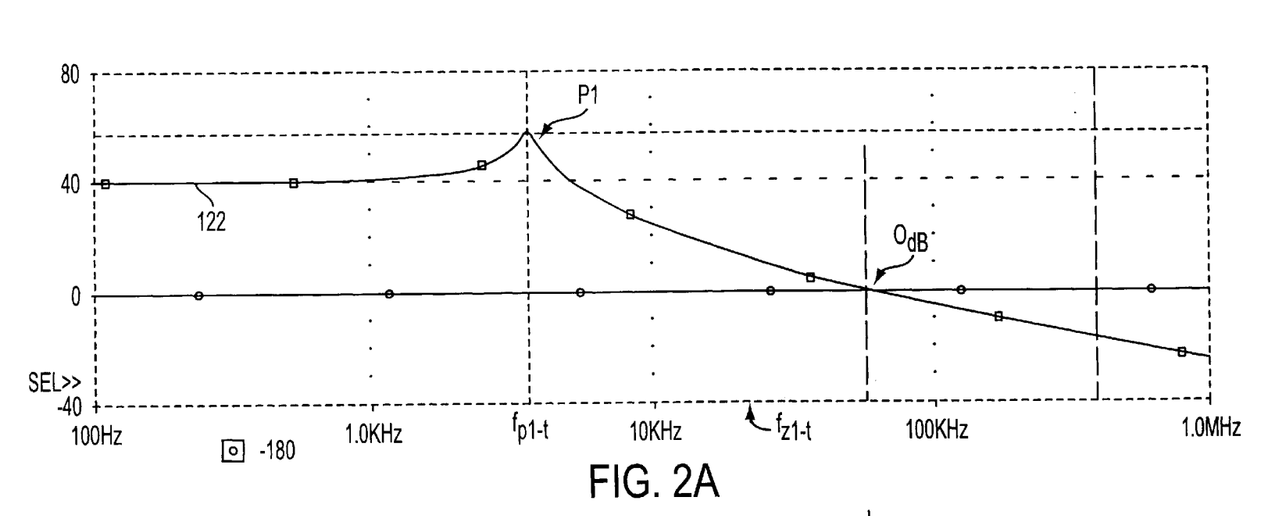
FIGS. 2A and 2B show a gain and phase Bode plots, respectively, of the response of the prior art output stage of FIG. 1, where a Tantalum capacitor is employed for capacitance.
Figure 2B:
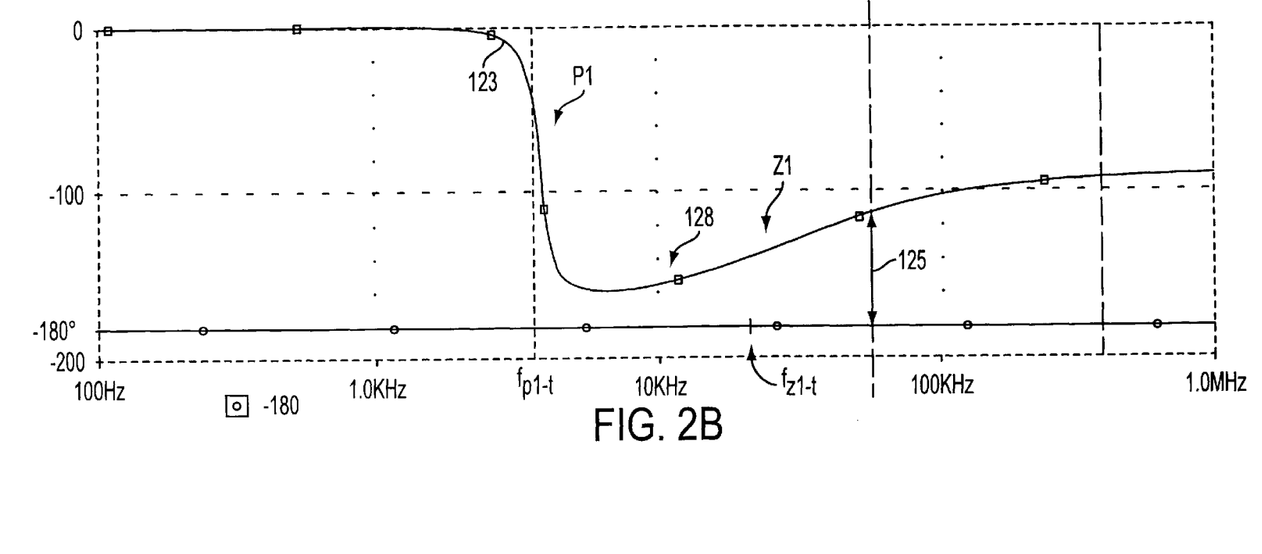

FIGS. 2A and 2B show Bode plots of the response of output stage 120, where a Tantalum capacitor is employed for capacitance C1. The Bode plot of FIG. 2A depicts the gain 122 versus frequency, and FIG. 2B depicts the phase 123 versus frequency. It is shown that there is an initial drop of both gain 122 and phase 123 which is caused by pole P1 at pole frequency $f_{p1}$. Referring to FIG. 2B, as phase 123 shifts towards −180°, the phase margin 125 decreases. If the phase margin 125 drops below a predefined margin (for example 35°) the output signal 126 starts to become less stable as oscillation, noise and ripple become more apparent in output signal 126. However, phase 123 begins to shift up at reference 128 and the phase margin 125 begins to increase due to the introduction of a zero Z1 at zero frequency $f_{z1-t}$. Because of the relatively large ESR $R_{esr}$ of a Tantalum capacitor, zero frequency $f_{z1-t}$ is relatively close to pole frequency $f_{p1}$. If we assume output capacitor C1 is a Tantalum capacitor of 40 uF, a typical ESR $R_{esr}$ is approximately 0.15 ohms. If we further assume inductance L1 is 47 uH, and utilizing equation 2, the zero frequency $f_{z1-t}$ is approximately equal to 26.5 KHz. Because the zero frequency $f_{z1-t}$ of the Tantalum capacitance is relatively close to the pole frequency $f_{p1-t}$, zero Z1 compensates for pole P1 and maintains a sufficient phase margin 125 to ensure a stable output. Thus, the Tantalum capacitor compensates for the pole P1 and shifts phase 123 back to a more stable region, resulting in a more stable output with reduced oscillation and noise.

Figure 3A:
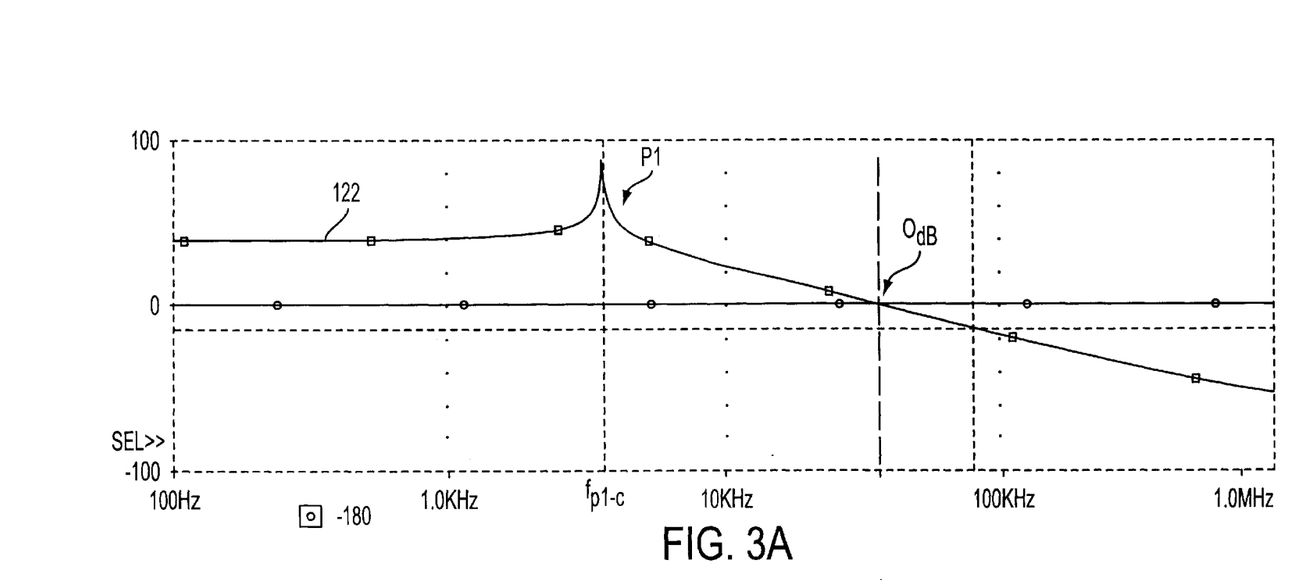
FIGS. 3A and 3B show a gain and phase Bode plots, respectively, of the response of the prior art output stage of FIG. 1, where a ceramic capacitor is used in output stage for the capacitor.
Figure 3B:
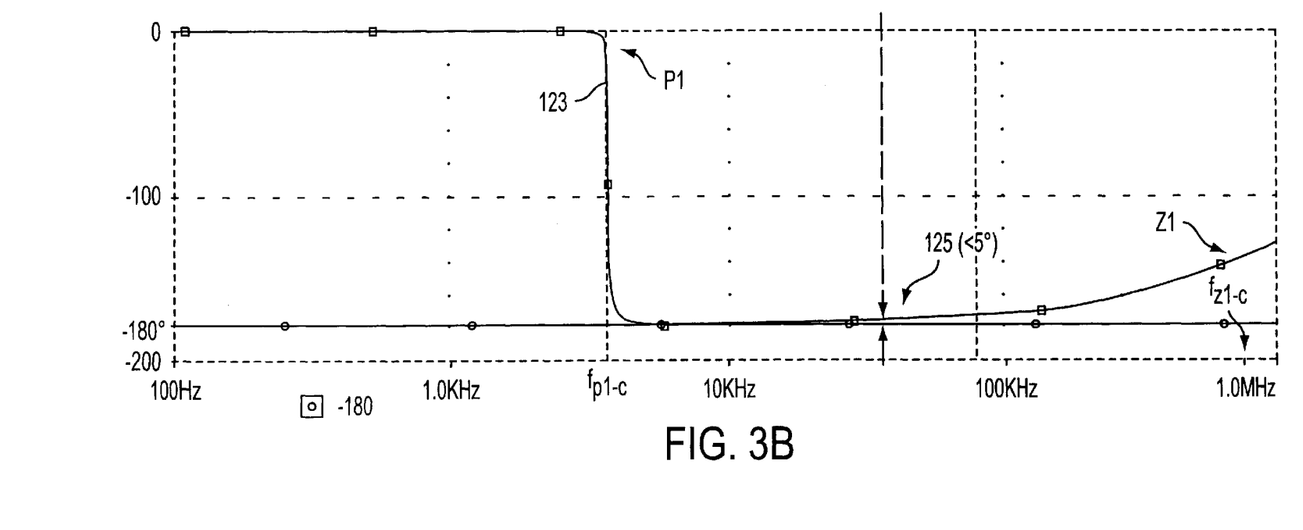

FIGS. 3A and 3B show Bode plots of the response of output stage 120, where a ceramic capacitor is used in output stage 120 for capacitor C1. As was the case with the Tantalum capacitor, pole P1 causes an initial drop in both gain 122 and phase 123. However, unlike the phase resulting from the Tantalum capacitor as shown in FIG. 2B, phase 123 does not begin to ramp up to compensate for pole P1 because zero frequency $f_{z1-c}$ of zero Z1 for ceramic capacitance C1 is significantly greater than zero frequency $f_{z1-t}$ for Tantalum capacitor. This results in substantially a zero phase margin 125 (less than 5°) causing oscillation in output signal 126. The low phase margin 125 and lack of compensation for the phase shift caused by the pole P1 is due to the significantly smaller ESR $R_{esr}$ of ceramic capacitors. If we assume capacitor C1 is a ceramic capacitor of 40 uF, a typical ESR $R_{esr}$ is approximately 0.005 ohms. If we further assume inductance L1 is 47 uH, then, utilizing equation 2, the zero frequency $f_{z1-c}$ is approximately equal to 796 KHz, which is approximately 30 times the zero frequency $f_{z1-t}$ for the Tantalum capacitance. Because the zero Z1 occurs at a frequence which is significantly greater than the pole frequency $f_{p1}$, and often greater than the operating frequency of the circuit utilizing filter 120, the phase margin 125 is substantially zero until zero Z1 begins to compensate for the pole P1. The relatively small or zero phase margin 125 results in an unstable output signal 126.

Therefore, Tantalum, aluminum electrolytic and other capacitors with larger ESR's than ceramic capacitors have long been utilized in output circuits requiring a stabilized output signal 126, such as switching voltage regulators. However, the cost of these capacitors are substantially greater than the cost of ceramic capacitors thus greatly increasing the cost of manufacturing. Further, Tantalum capacitors are in extremely short supply. Thus the manufacturing of devices utilizing Tantalum capacitors may be drastically delayed because the Tantalum capacitors cannot be obtained, causing further increased costs.

SUMMARY

In accordance with the teachings of this invention a novel method and apparatus is taught which provides for the stabilizing of an output signal through an output circuit having a compensation circuit coupled with an output capacitor, such that the compensation circuit is configured to compensate for an equivalent series resistance of the output capacitor. The compensation circuit compensates for the equivalent series resistance by providing a shift in a phase of the output signal to stabilize the output signal. The shift in phase is accomplished through the addition of a second zero at a second zero frequency to stabilize the output signal. The second zero is added such that the second zero frequency is closer to a first pole frequency than a first zero frequency, where the first zero frequency is proportional to the equivalent series resistance and the first pole is proportional to the output capacitor.

In one embodiment, the compensation circuit is configured to provide a shift in the phase of the output signal such that the output signal closely resemble a signal from an output stage having a Tantalum capacitor. In one embodiment, the output capacitor is a ceramic capacitor and the compensation circuit includes at least a compensation inductor and a compensation resistor.

BRIEF DESCRIPTION OF THE DRAWINGS

The invention, together with further advantages thereof, may best be understood by reference to the following description taken in conjunction with the accompanying drawings in which.

DETAILED DESCRIPTION

The present invention provides for an output stage or filter which delivers a stable output with reduced oscillation and noise, which replaces prior art output stage or filter circuits which require the use of costly and difficult to obtain tantalum, aluminum electrolytic or other capacitors having relatively large equivalent series resistance (ESR) as compared with ceramic capacitors. In one embodiment, the novel output stage or filter of the present invention utilizes less costly and more easily obtainable relatively small ESR ceramic capacitors with additional circuitry to reduce output voltage oscillation and noise. The oscillation and noise reduction obtained by the present invention is typically a factor of 20 to 1 over a filter using a capacitor with a relatively large ESR, such as a tantalum, aluminum electrolytic or other large ESR capacitors. In one embodiment, the novel filter or output stage of the present invention also mimics the frequency response of other filters utilizing tantalum and other relatively large ESR capacitors, while the present invention utilizes smaller ESR, lower cost and more readily available ceramic capacitors. The inventive output stage of the present invention is employed in substantially any system implementing a noise reduction output stage, such as in the power supply industry. The inventive output stage is further employed in place of the existing, prior art filters using tantalum or other relatively large ESR capacitors. For example, the output filter of the present invention is placed at the output of a switching power supply to reject high frequency switching noise being generated by the power supply.

One of the problem with using ceramic capacitors in filters or output stages is that an ESR zero, resulting from the relatively low ESR of ceramic capacitors, occurs at a relatively large zero frequency $f_{z1}$ which is often greater than the operating frequency of the system utilizing the output filter. This ESR zero occurring out beyond the operating frequency causes a feedback control system to go unstable due to the lack of phase margin. The output stage of the present invention maintains a stable output and phase margin while allowing the use of relatively low ESR ceramic capacitors by adding a second or double zero, thus in effective adding a phase boost, to compensate for the ESR zero caused by the ceramic capacitance. In one embodiment, the present invention further allows the fine tuning of the phase margin for specific applications by maintaining Q and a dampening resistance of the novel output stage as will be described more fully below.

Figure 4A:
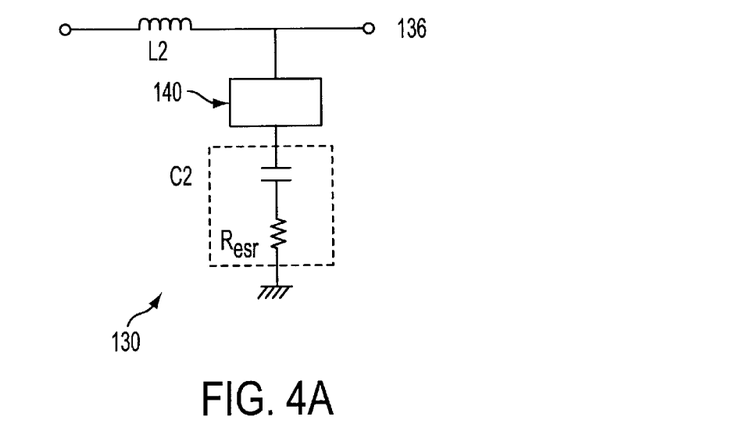
FIG. 4A depicts a simplified block diagram of one implementation of one embodiment of an output stage of the present invention where a compensation circuit is coupled in series with the output capacitor.
Figure 4B:
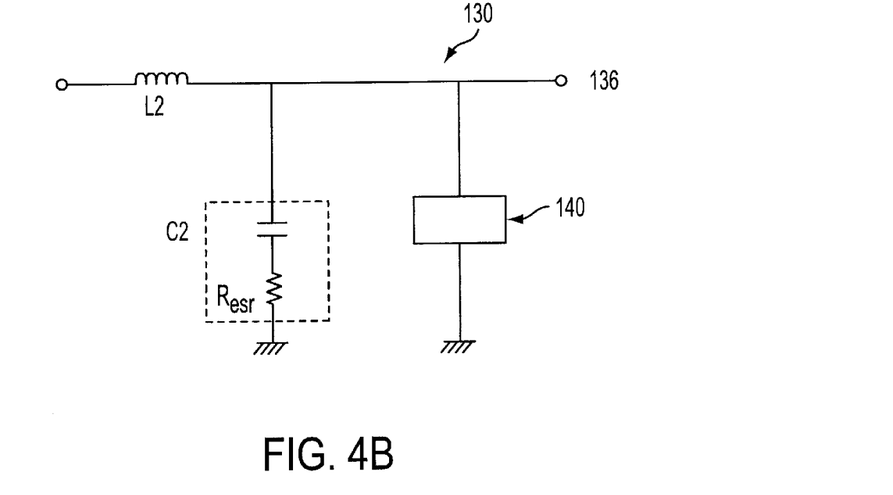
FIG. 4B depicts an alternative implementation of one embodiment of the output stage of the present invention, where the compensation circuit is coupled in parallel with the output capacitor.

FIG. 4A depicts a simplified block diagram of one implementation of one embodiment of an output stage 130 of the present invention. Output stage 130 includes an output inductor L2, and output capacitor C2 having an equivalent series resistance $R_{esr}$. Additionally, output stage 130 includes a means for compensating or compensation circuit 140 coupled in series with output capacitor C2. Compensation circuit 140 allows output circuit 130 to be implemented utilizing a ceramic capacitance for capacitor C2 by compensating for a first zero Z1 occurring at the relatively large zero frequency $f_{z1}$ due to the small ESR $R_{esr}$ of a ceramic capacitance as compared with the ESR $R_{esr-t}$ and zero frequency $f_{z1-t}$ of a Tantalum capacitance. FIG. 4B depicts an alternative implementation of one embodiment of output stage 130, where the compensation circuit 140 is coupled in parallel with capacitor C2.

In one embodiment, compensation circuit 140 in conjunction with the capacitor C2 provides the second or double zero Z2. Second zero Z2 occurs at a second zero frequency $f_{z-2}$ which is a lower frequency than first pole frequency $f_{z1}$ allowing compensation of first pole P1 at pole frequency $f_{p1}$ as defined by $f_{p1}=1/(2\pi*sqrt(L2*C2))$ (see equation 1 above). The compensation of first pole P1 thus maintaining the phase margin 125 at a sufficient level to stabilize the output signal 136. In one embodiment, the second zero frequency $f_{z-2}$ is ensured to be below the operating frequency of the system, such as a power supply, implementing output stage 130. For example, the second zero frequency $f_{z-2}$ of second zero Z2 is configured to be approximately one quarter of the operating frequency of the system implementing the output stage 130 to optimize phase margin 125.

Figure 5:
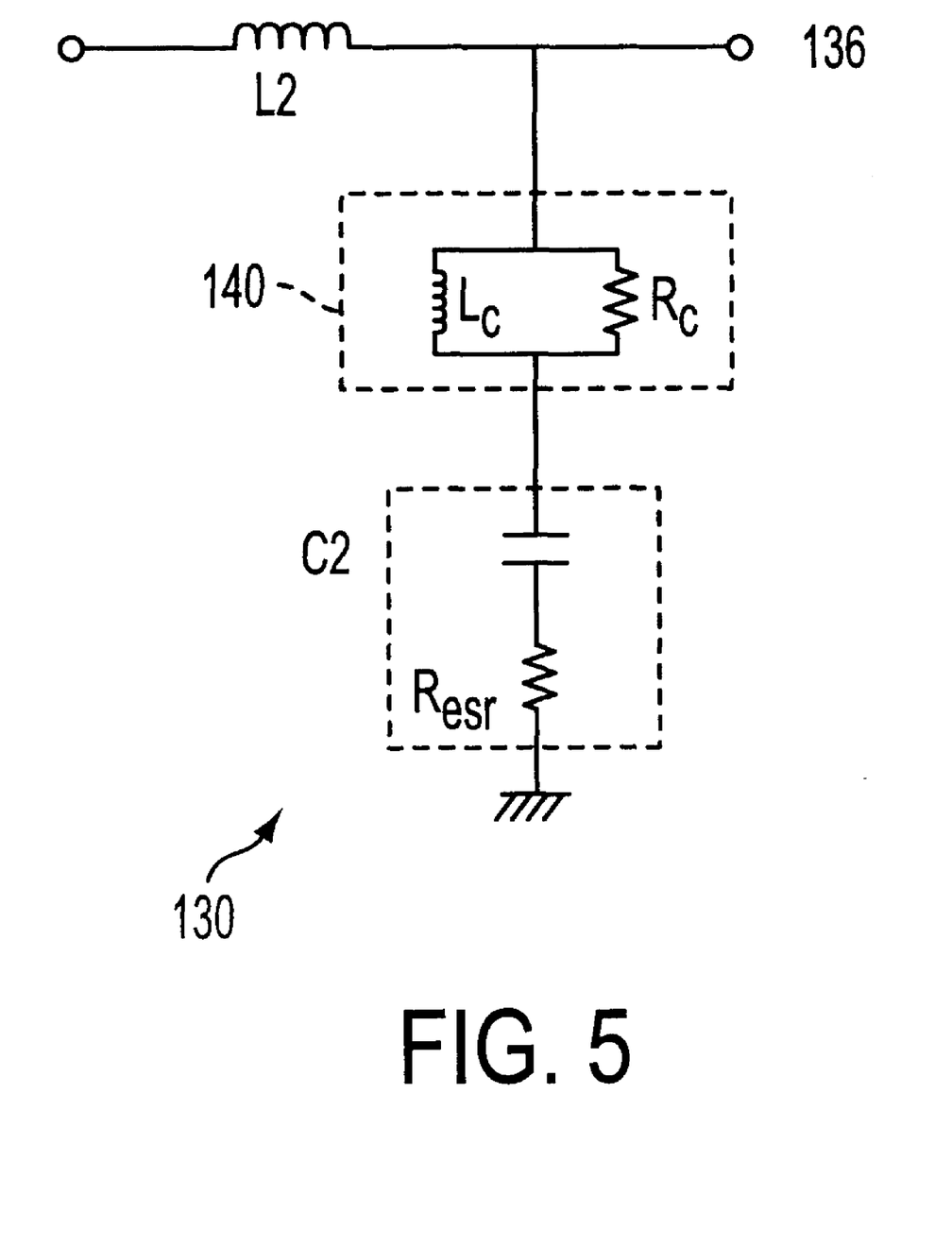
FIG. 5 depicts a simplified schematic diagram of one implementation of one embodiment of the output stage of the present invention where the compensation circuit is coupled between the output inductor and output capacitor similar to that shown in FIG. 4A.

FIG. 5 depicts a simplified schematic diagram of one implementation of one embodiment of the output stage 130 of the present invention where compensation circuit 140 is coupled between output inductor L2 and output capacitor C2 similar to that shown in FIG. 4A. Capacitor C2 is implemented with a ceramic capacitor with a relatively small ESR $R_{esr}$.

In one embodiment, compensation circuit 140 includes a compensation inductor $L_c$ coupled in parallel with a compensation resistor $R_c$. Compensation inductor $L_c$ in conjunction with capacitor C2 defines second zero frequency $f_{z-2}$ of the second zero Z2. Second zero frequency $f_{z-2}$ is approximated by:

$$f_{z-2}=\tfrac{1}{2}\pi*(sqrt(L2*C1)) \qquad \text{Eq. 3}$$

Assuming capacitor C2 is equal to 40 uF with an ESR $R_{esr}$ equal to 0.005 ohms, and compensation inductor $L_c$ equals 180 nH, second zero frequency $f_{z-2}$, as defined by equation 3, is approximately equal to 59 KHz. This brings the previously calculated non-compensated zero Z1 caused by C2 and the 0.005 ohm ESR of the ceramic capacitor C2 from 796 KHz (as described above with reference to equation 2) to second zero frequency $f_{z-2}$ of the second zero Z2 now at 59 kHz. This second zero Z2 provides a phase boost and allows output stage 130 to provide a phase margin which optimizes a feedback control of the system implementing output stage 130. The compensation provided by compensation circuit 140 provides additional stability, and output noise rejection while utilizing a ceramic capacitor for capacitor C2.

Figure 6A:
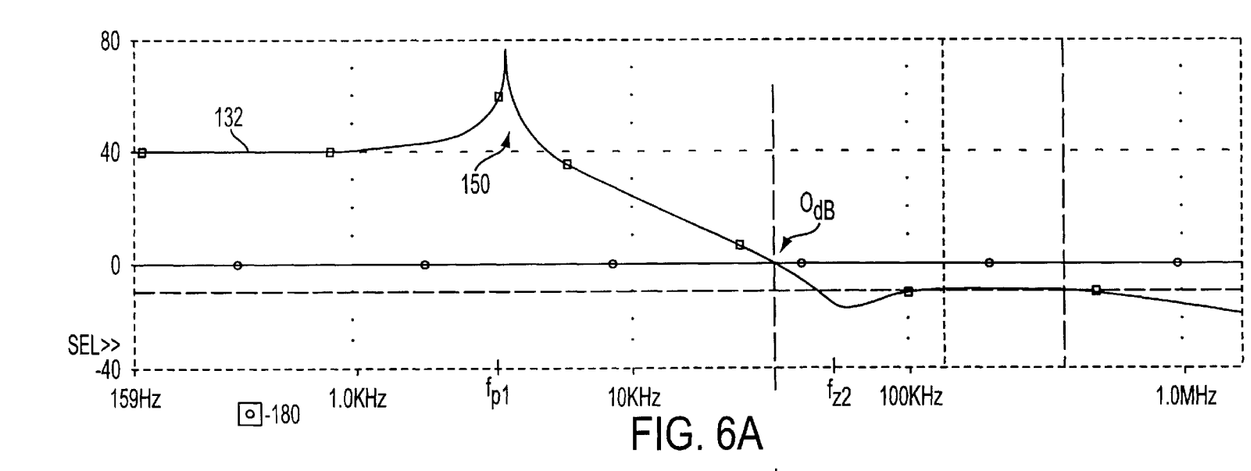
FIGS. 6A and 6B show Bode plots graphically depicting the gain and phase, respectively, of the output signal as generated from an output stage similar to that shown in FIG. 5.
Figure 6B:
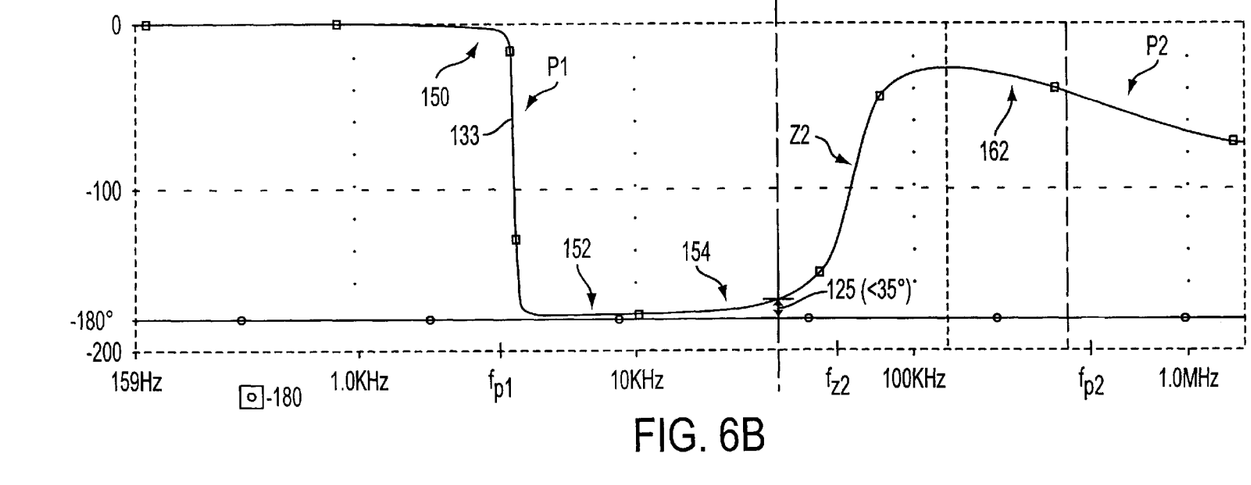

FIGS. 6A and 6B show Bode plots graphically depicting the gain 132 and phase 133 of the output signal 136 as generated from an output stage 130 with compensation circuit 140 similar to that shown in FIG. 5. Referring to FIGS. 6A–B, as was seen in the Bode plots of FIGS. 2B and 3B, there is an initial drop in both gain 132 and phase 133 at reference 150 caused by first pole P1 at pole frequency $f_{p1}$ as defined above by equation 1. Then the phase 133 begins to stable out at reference 152. Phase 133 of the output signal 136 then begins to ramp up at reference 154 stabilizing output signal 136 and providing a phase margin 125, thus reducing noise and oscillation. In one embodiment, the phase margin is maintained at a level greater than 35°, preferably the phase margin is maintained between 35° and 60°. The shift 154 in phase 133 results from the second zero Z2 at second zero frequency $f_{z-2}$ as defined by compensation circuit 140, compensating for first pole P1 at a lower frequency than would normally be provided by a ceramic capacitor. Thus, the present inventive output stage 130 eliminates the need to use Tantalum, aluminum electrolytic or other such capacitors for output capacitor C2 in output stage 130 while still providing a stable output 136 with reduced noise and oscillation, and allowing the use of less expensive and readily available ceramic capacitors for C2.

Figure 7:
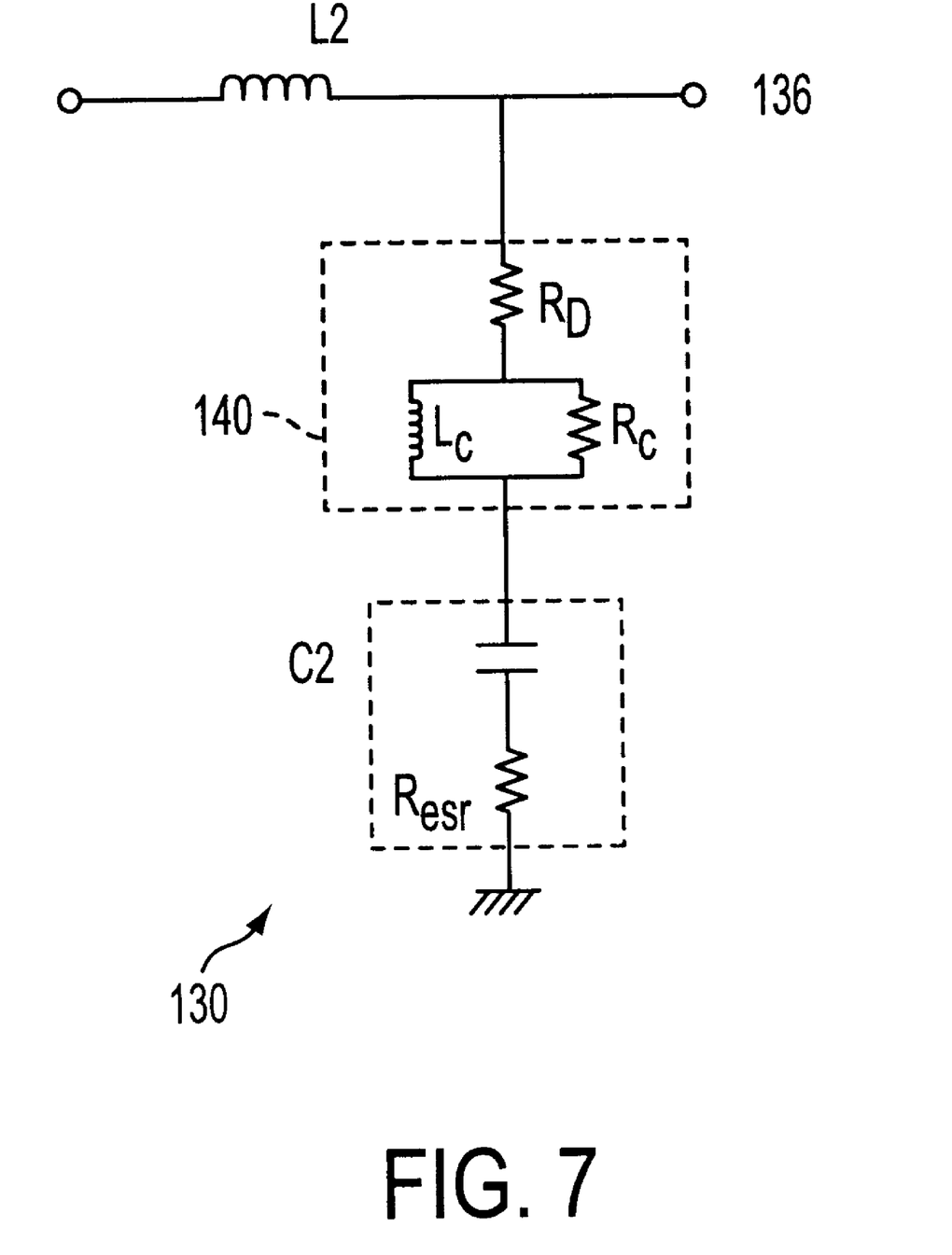
FIG. 7 depicts a simplified schematic diagram of one implementation of one embodiment of the output stage of the present invention where a dampening resistance is incorporated.

FIG. 7 depicts a simplified schematic diagram of one implementation of one embodiment of the output stage of the present invention where a dampening resistance $R_D$ is incorporated. Dampening resistance $R_D$ and compensation inductor $L_c$ provide a second pole P2 at a second pole frequency $f_{p2}$. By setting the second pole frequency $f_{p2}$ at a frequency greater than second zero frequency $f_{z2}$ of the second zero Z2, the second pole P2 rolls off the high frequency noise and dampens the effects of second zero Z2 resulting from output capacitor C2 and the compensation inductor $L_c$. The inclusion of the dampening resistance $R_D$ allows the fine tuning of the phase margin 125 and provides a means for dampening the effects of the second zero Z2. Second pole frequency $f_{p2}$ is approximated by:

$$f_{p2}=R_D/2\pi*L_c \qquad \text{Eq. 4}$$

Thus, dampening resistance $R_D$ is utilized, in one embodiment, to fine tune the second pole frequency $f_{p2}$. In one embodiment, phase margin 125 is optimized when second pole frequency $f_{p2}$ is greater than the operating frequency of the system utilizing output stage 130. For example, in one embodiment, the optimum phase margin 125 is achieved when second pole frequency $f_{p2}$ is equal to approximately 2.5 times the operating frequency ($f_{op}$) *of the system utilizing output stage 130. By rewiring equation 4 as $R_{D=fp2}*(2\pi*L_c)$ and assuming second pole frequency $f_{p2}$ equals 2.5*($f_{op}$), then equation 4 can be rewritten as:

$$R_D=2\pi*L_c*(2.5*f_{op})=5\pi*L_c*f_{op} \qquad \text{Eq. 5}$$

Figure 8A:
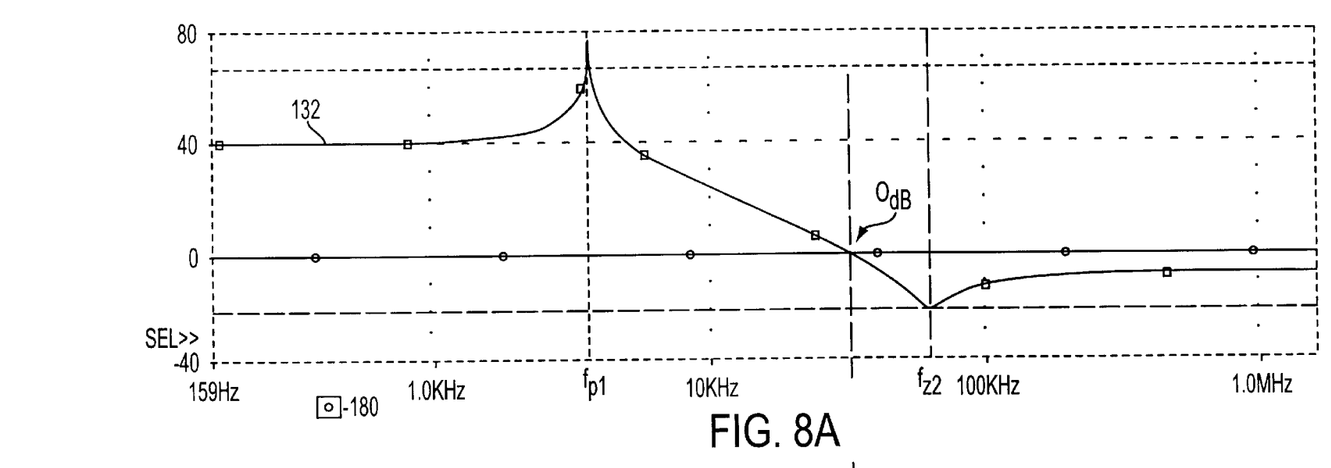
FIGS. 8A–B show simplified graphical representations of Bode plots of gain and phase, respectively, of an output signal generated through the output circuit as shown in FIG. 7, where dampening resistance is 5.0 ohms.
Figure 8B:
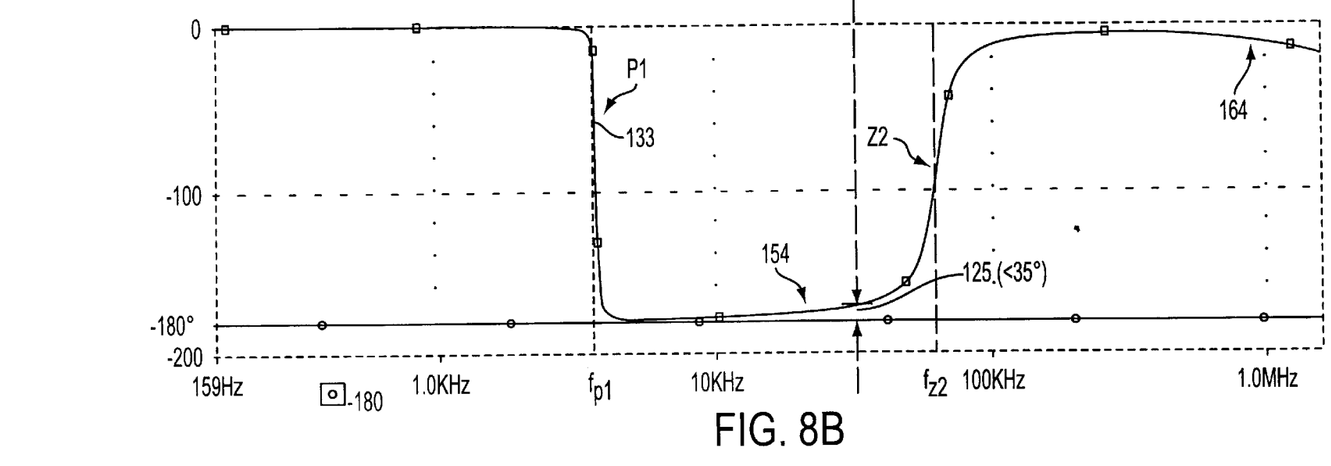
Figure 9A:
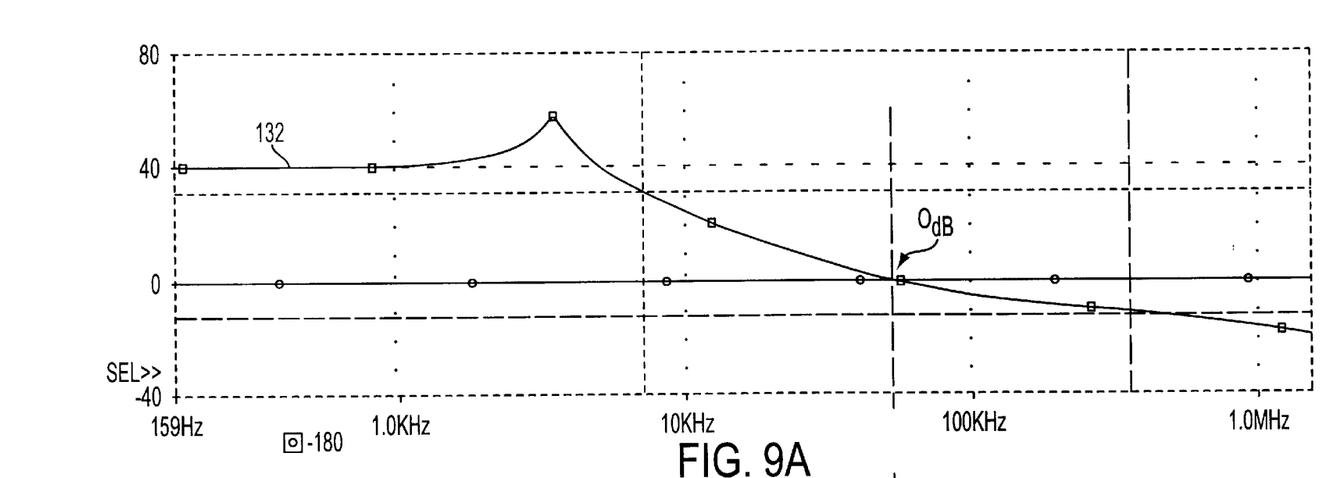
FIGS. 9A–B show a graphical representation of gain and phase Bode plots, of respectively, the output signal as generated through the output circuit shown in FIG. 7, where dampening resistance is 0.5 ohms.
Figure 9B:
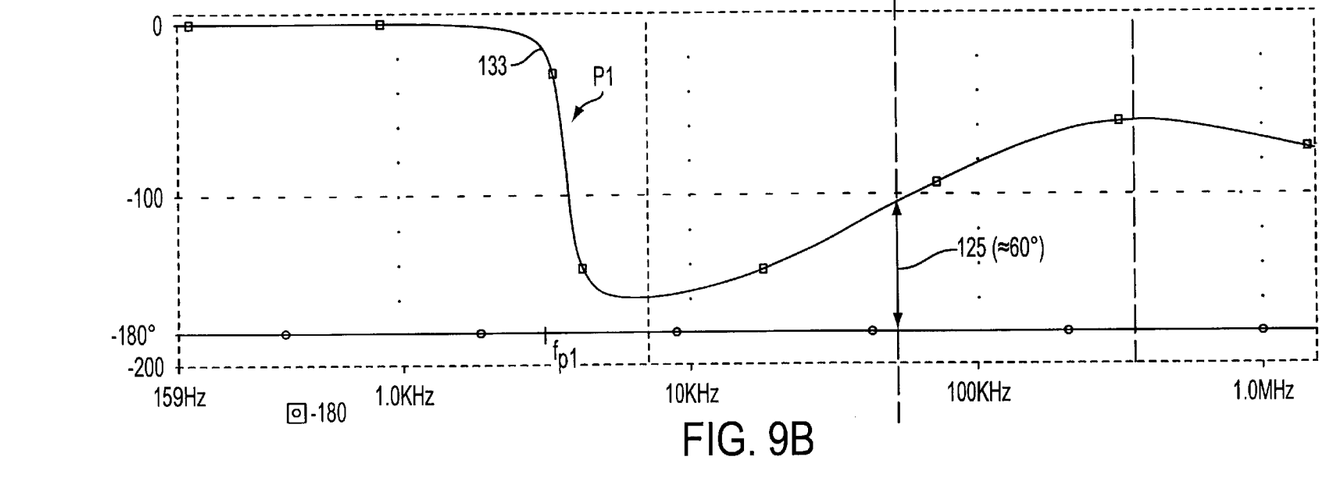

Assuming the compensation inductor $L_c$ is equal to 180 nH and the operating frequency is 200 KHz, a dampening resistance of 0.565 ohms provides a second pole P2 at the desired second pole frequency $f_{p2}$. FIGS. 6A–B and 8A–B show simplified graphical representations of Bode plots of gain 132 and phase 133 of an output signal 136 generated through output circuit 130 including compensation circuit 140 where dampening resistance $R_D$ is adjusted to demonstrate the compensation for the second zero Z2. In FIGS. 6A and 6B, a dampening resistance equal to 0.5 ohms is utilized in output circuit 130, resulting in a second pole frequency $f_{p2}$ equal to approximately 442 KHz. Referring to FIG. 6B, the phase 133 begins to ramp up at reference 154 due to the second zero Z2, but at reference 162 the phase 133 begins to ramp back down due to second pole P2 at second pole frequency $f_{p2}$ dampening the effects of second zero Z2. Referring to FIGS. 8A and 8B, a dampening resistance $R_D$ equal to 5.0 ohms is utilized resulting in a second pole frequency $f_{p2}$ equal to approximately 4.42 MHz, as dictated by equation 4. Referring to FIG. 8B, phase 133 begins to ramp up at reference number 154. However, phase 133 does not begin to shift back down until reference 164. As a result, phase margin 125 increases significantly compared with the phase margin 125 seen in FIG. 6B. This is due to the fact that a dampening resistance $R_D$ of 5.0 ohms results in a second pole frequency $f_{p2}$ approximately equal to 4.42 MHz (4.42 MHz is beyond the frequency range shown in FIG. 8B) which is much greater than second zero frequency $f_{z-2}$ of second zero Z2, and not providing dampening effects until higher frequencies. Alternatively, second pole P2 caused by $R_D$=0.5 ohms has a second pole frequency $f_{p2}$ which is closer to second zero frequency $f_{z-2}$ and thus has a greater dampening effect.

The stability and transient response of output signal 136 produced by output stage 130 is further optimized by adjusting the Q of output stage 130. Q is a factor of compensation inductor $L_c$ and output capacitor C2. In one embodiment, the Q of output stage 130 is preferably between 0.1 and 1.0 and more preferably between 0.3 and 0.8. The Q is approximately equal to a characteristic impedance ($R_o$) divided by a DC resistance ($R_{Lc\text{-}dcr}$) (not shown) of the compensation inductor $L_c$:

$$Q = R_o / R_{Lc\text{-}dcr}, \qquad \text{Eq. 7}$$

where characteristic impedance $R_o = \text{sqrt}(L_c/C2)$. Again assuming the compensation inductor is 180 nH and output capacitor C2 is 40 uF, then the characteristic impedance $R_o$ equals 0.067 ohms. By adjusting or changing the $R_{Lc\text{-}dcr}$ of output inductor $L_c$ the Q is optimized. Thus, $R_{Lc\text{-}dcr}$ provides a means for optimizing phase margin 125. FIGS. 6A–B and 9A–B show a graphical representation of Bode plots of the gain 132 and phase 133 of output signal 136. Comparing FIGS. 6B and 9B, the effects of altering the Q value are seen. FIG. 6B shows phase 133 of output signal 136 when $R_{Lc\text{-}dcr}$ is approximately equal to 0.01 ohms resulting in a high Q of approximately 6.7. With the high Q, the phase 133 shown in FIG. 6B has a more rapid rise following second zero Z2 in comparison with the phase 133 shown in FIG. 9B. In generating the output shown in FIG. 9B, a compensation inductor $L_c$ with an $R_{Lc\text{-}dcr}$ of approximately 0.2 ohms is utilized, resulting in a desired low Q of approximately 0.34, as defined by equation 7. As such, the phase margin 125 is maintained at values much closer to that depicted in FIG. 4B showing the phase of the prior art output stage utilizing a Tantalum capacitor. In one embodiment, maintaining Q within the desired range allows the output stage 130 of the present invention to more closely mimic the effects of a prior art LC output stage without the need to utilize costly Tantalum or other relatively large ESR capacitors, as is required in prior art output stages.

In one embodiment, the present invention provides for the control or regulation of an output voltage supplied to a load through output stage 130 which implements a ceramic capacitor C2 while providing output signal 136 which is more stable and has an improved gain than is provided through a prior art output stage which utilizes a Tantalum capacitor. The method and apparatus of the present invention is capable of maintaining a stable output signal regardless of the input voltage level, output current or desired output voltage level.

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents. Having disclosed exemplary embodiments and the best mode, it will be apparent to one of ordinary skill in the art that many changes and modifications can be made thereto without departing from the spirit or scope of the appended claims.

What is claimed is:

1. An output stage, coupleable to a circuit having a series-coupled output inductance L2, to deliver a stable output signal from an output node of said inductance L2, the output stage comprising:

an output ceramic capacitor C2 having an equivalent series resistance Resr that affects phase shift of said output signal, said C2 and Resr together defining a first zero frequency;

a compensation circuit comprising a resistor Rc coupled in parallel with an inductor Lc;

said compensation circuit coupled in series with said output ceramic capacitor C2 between said output node and ground;

said ceramic capacitor C2 and said inductor Lc defining a compensating second zero frequency lower than said first zero frequency, wherein phase margin and stability of said output stage is increased.

2. The output stage of claim 1, wherein magnitude of said first zero frequency exceeds magnitude of said second zero frequency by at least thirteen.

3. The output stage of claim 1, wherein phase margin of said output signal is at least about 10°.

4. The output stage of claim 1, wherein phase margin of said output signal is in a range of about 20° to about 60°.

5. The output stage of claim 1, further including a damping resistor Rd coupled in series with said output stage so as to affect overall quality Q of frequency response of said output stage.

6. The output stage of claim 5, wherein magnitude of said damping resistor Rd causes magnitude of Q to be in a range of about 0.1 to about 0.9.

7. The output stage of claim 5, wherein said damping resistor Rd and said inductor Lc define a pole frequency greater than an operating frequency of a circuit to which said output stage is coupled.

8. The output stage of claim 7, wherein magnitude of said pole frequency determined by Rd and Lc is about 2.5 times magnitude of said operating frequency.

9. A method of using a ceramic capacitor C2 to stabilize an output signal from a circuit having a series-coupled output inductance L2, said ceramic capacitor C2 having an equivalent series resistance Resr affecting phase shift of said output signal, the output signal being delivered from an output node of said inductance L2, the method comprising:

determining a first zero frequency determined by said C2 and Resr; and providing a compensation circuit comprising a resistor Rc coupled in parallel with an inductor Lc, said compensation circuit coupled in series with said output ceramic capacitor C2 between said output node and ground;

said ceramic capacitor C2 and said inductor Lc defining a compensating second zero frequency lower than said first zero frequency, wherein phase margin and stability of said output stage is increased.

10. The method of claim 9, wherein magnitude of said first zero frequency exceeds magnitude of said second zero frequency by at least thirteen.

11. The method of claim 9, wherein phase margin of said output signal is at least about 10°.

12. The method of claim 9, wherein phase margin of said output signal is in a range of about 20° to about 60°.

13. The method of claim 9, further including damping overall quality Q of frequency response of said output stage.

14. The method of claim 9, further including coupling a damping resistor Rd in series with said output stage so as to cause magnitude of quality Q of frequency response of said output stage to be in a range of 0.1 to about 0.9.

15. The method of claim 13, wherein damping includes coupling a damping resistor Rd in series with said output stage, wherein said damping resistor Rd and said inductor Lc define a pole frequency greater than an operating frequency of a circuit to which said output stage is coupled.

16. The method of claim 15, wherein magnitude of said pole frequency determined by Rd and Lc is about 2.5 times magnitude of said operating frequency.

* * * * *